United States Patent [19]
Moran

[11] Patent Number: 5,821,543
[45] Date of Patent: Oct. 13, 1998

[54] TRANSVERSE-STRUCTURE ELECTROSTATIC CHARGED PARTICLE BEAM LENS

[75] Inventor: Michael J. Moran, Pleasanton, Calif.

[73] Assignee: The Regents of the University of California, Oakland, Calif.

[21] Appl. No.: 906,303

[22] Filed: Aug. 5, 1997

[51] Int. Cl.⁶ .................................................. H01J 37/147
[52] U.S. Cl. ...................................................... 250/396 R
[58] Field of Search ....................... 250/396 R, 396 ML; 313/432, 439

[56] References Cited

U.S. PATENT DOCUMENTS

| | | | |
|---|---|---|---|
| 3,973,125 | 8/1976 | Loebe | 250/443 |
| 4,168,434 | 9/1979 | Lischke et al. | 250/396 ML |
| 4,287,419 | 9/1981 | Booth | 250/396 ML |
| 4,544,847 | 10/1985 | Taylor | 250/396 ML |
| 4,963,748 | 10/1990 | Szilagyi | 250/396 R |
| 5,298,757 | 3/1994 | Okayama | 250/396 R |

*Primary Examiner*—Kiet T. Nguyen
*Attorney, Agent, or Firm*—John P. Wooldridge

[57] ABSTRACT

Electrostatic particle-beam lenses using a concentric co-planar array of independently biased rings can be advantageous for some applications. Traditional electrostatic lenses often consist of axial series of biased rings, apertures, or tubes. The science of lens design has devoted much attention to finding axial arrangements that compensate for the substantial optical aberrations of the individual elements. Thus, as with multi-element lenses for light, a multi-element charged-particle lens can have optical behavior that is far superior to that of the individual elements. Transverse multiple-concentric-ring lenses achieve high performance, while also having advantages in terms of compactness and optical versatility.

11 Claims, 3 Drawing Sheets

TRANSVERSE-STRUCTURE ELECTROSTATIC CHARGED PARTICLE BEAM LENS

The United States Government has rights in this invention pursuant to Contract No. W-7405-ENG48 between the United States Department of Energy and the University of California for the operation of Lawrence Livermore National Laboratory.

BACKGROUND OF THE INVENTION

1. Field of the Invention

The present invention relates to charged particle beam technology, and more specifically, it relates to a charge particle beam lens.

2. Description of Related Art

Electrostatic lenses use electric fields to focus charged particle beams, but the basic nature of the field distributions results in complicated optical behavior. The electric fields are associated with charge distributions that reside on biased electrodes having specific geometries. Because of the nature of electric fields, a charged particle beam experiences both focusing and defocusing forces as it passes through an electrostatic lens. Thus, the desired focusing effect must be the net difference between the two forces. Furthermore, since the 1/r nature of the Coulomb field has infinite extent, electrostatic lenses tend to be "thick." This means that particle trajectories change substantially while they are passing through a lens.

These complications mean not only that theoretical analysis of electrostatic lenses is complex, but also that electrostatic lenses tend to have substantial aberrations that degrade their performance. The traditional approach to compensating for aberrations has been to use a linear sequence of simple lens elements, such as biased rings, apertures, or tubes, whose individual aberrations compensate for each other. Such a lens system can have an overall performance that is far superior to that of a single lens element. More recently, the advent of software for numerical modeling of lens performance on personal computers has helped to improve the design of high-performance lens systems. These newer designs often use fewer lens elements, but with rather sophisticated three-dimensional geometries.

U.S. Pat. No. 5,298,757, titled "Lens For Charged Particle Beam" is directed to a lens for a charged particle beam comprising first, second, third and fourth quadrupoles. The invention includes a first aperture electrode placed in front of the first quadrupole, a second aperture electrode placed between the first quadrupole and the second quadrupole, a third aperture electrode placed between the second quadrupole and the third quadrupole, a fourth aperture electrode placed between the third quadrupole and the fourth quadrupole, a fifth aperture electrode placed behind the fourth quadrupole, means for exciting the quadrupoles to cause them to converge the charged beam to a line near the third aperture electrode, and means for applying voltage to excite the first to fifth aperture electrodes and cause them to produce an octupole lens action for correcting aperture aberration.

U.S. Pat. No. 4,544,847, titled "MultiGap Magnetic Imaging Lens For Charged Particle Beam" is directed to a magnetic lens for imaging and rotation of a charged particle beam and includes a pair of focus elements axially spaced along a lens bore through which the beam passes and a rotation element positioned axially between the focus elements. Each of the lens elements includes a polepiece having opposing portions surrounding the lens bore and axially spaced apart to define a circumferential gap, and a winding for energizing the polepiece and the gap. The focus elements are energized by equal and opposite magnetic fields which focus the electron beam without substantial beam rotation. The beam can be rotated, without substantial change in focus or magnification, by varying the magnetic field of the rotation element. The lens is particularly suited for use in a shaped electron beam lithography system.

U.S. Pat. No. 4,287,419, titled "Strong Focus Space Charge" is directed to a strong focus space charge lens wherein a combination of current-carrying coils and charged electrodes form crossed magnetic and electric fields to focus charged particle beams.

U.S. Pat. No. 4,168,434, titled "Long Focal Length Magnetic Lens For The Optical Imaging Of A Specimen Having A Large Surface Area" is directed to an improved magnetic lens having a long focal length for the optical imaging of a specimen having a large surface area by means of a charged-particle beam. The lens includes a cylindrical coil including at least one winding which is surrounded by a field-carrying metallic shell member fabricated of magnetic material disposed at the radially outer surface of the winding. The improvement of the invention comprises a first ring member disposed on the radially outer surface of the metallic shell member approximately in the plane of the center of gravity of the lens; a plurality of slidable shoe members disposed on a lower surface of the first ring member; a housing fabricated of magnetic material surrounding the lens and including an annular shoulder on the radially inner surface thereof; a second ring member fabricated of non-magnetic material disposed on the annular shoulder for supporting the slidable shoe members, the shoe members being disposed between the first and second ring members; and at least three adjusting pin members distributed approximately uniformly over the surface of the housing and fabricated of non-magnetic material. The pin members extend through the housing and engage the first ring member of the metallic shell member for adjusting the position of the lens in a direction perpendicular to the axis of the lens.

U.S. Pat. No. 3,973,125, titled "Corpuscular-Ray Apparatus With A Cryogenically Cooled Specimen Space" is directed to a charged particle-beam apparatus having a lens device that includes a charged particle-beam lens defining a beam axis and having two centrally apertured lens members formed of magnetic material and axially spaced from each other to form a space there between, the apertures of the lens members defining a lens bore, specimen holder means extending axially into the lens bore for holding a specimen therein, a first cooling body situated in the space between the lens members in heat insulating relation to the lens members and extending about the axis in a plane substantially perpendicular to the latter, the first cooling body consisting of non-magnetic material and having a central opening at least substantially equal in diameter to the lens bore so that the first cooling body is prevented from protruding into the lens bore, the central opening being defined by an inner wall of the first cooling body extending axially between the lens members and circumferentially facing the specimen holder means, heat-conductive connecting means for connecting the first cooling body to a cryogenic source, whereby the surface of the first cooling body, when cooled, reduces soiling of the specimen, a second cooling body disposed above the lens, the specimen holder means having a face directed away from the lens, the second cooling body being located adjacent the face of the specimen holder means and being formed with a central opening surrounding the beam axis and having a diameter larger than the specimen holder means and at least as large as the diameter of the lens bore whereby the second cooling body is prevented from protruding into the lens bore, and a second heat-conductive connecting means attached to the second cooling body for communicating with the cryogenic source.

SUMMARY OF THE INVENTION

It is an object of the present invention to provide an electrostatic lens.

The invention is an array of biased co-planar rings having a simple design that is convenient for numerical and theoretical analysis. This design inherently has a large number of independent parameters including the number, radii and widths of the rings, and their bias voltages. This multiple-ring lens, which can have zero net charge, exerts net focusing forces for particles passing near the center of the lens. When the total charge is zero, as the particle leaves the vicinity of the lens, it will experience fields that decay to zero much more quickly than 1/z. Thus, these multiple-ring lenses approach the "thin lens" limit much more effectively than single biased elements. Further, within the constraint of zero total charge, it is possible to vary the radial profile of the electrostatic potential distribution by varying the allocation of charges among the rings of the lens. This means that variation of the potentials on the lens rings can be used to control both the radial and longitudinal profiles of the electrostatic fields. While this certainly does not demonstrate superior performance, variation of the potentials on the individual rings can be used to control precisely those aspects of the electrostatic field that are important for designing low-aberration systems.

DETAILED DESCRIPTION OF THE INVENTION

Figure 1:
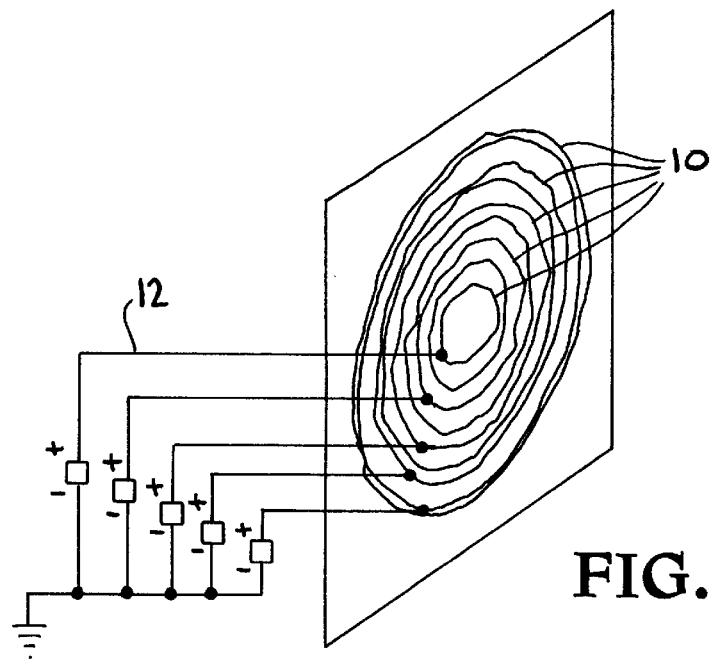
FIG. 1 illustrates the basic idea of the multiple-ring lens.

Referring to FIG. 1, the invention is an array of biased co-planar rings 10, having a simple geometry that makes possible high performance from a single lens element. Bias leads 12 provide potential to the co-planar rings 10. The geometry of this design is convenient for numerical and theoretical analysis, and some simple considerations suggest that the multiple-ring design might be superior to conventional lenses for some applications. This design inherently has a large number of independent parameters including the number, radii and widths of the rings, and their bias voltages. In the discussion that follows, bias voltage and charge on the rings will be used interchangeably, even though converting from one to the other may not always be easy to accomplish. For the moment, it is interesting to consider the versatility that is available from a single choice of rings (i.e., number, radii and widths), allowing only for variation of the bias potentials that are imposed on the rings.

Consider then, a multiple-ring lens which, although with zero net charge, exerts net focusing forces for particles passing near the center of the lens. Since the total charge is zero, as the particle leaves the vicinity of the lens, it will experience fields that decay to zero much more quickly than 1/z. Thus, it is expected that multiple-ring lenses can approach the "thin lens" limit much more effectively than single biased elements. Furthermore, within the constraint of zero total charge, it is possible to vary the radial profile of the electrostatic potential distribution by varying the allocation of charges among the rings of the lens. This means that variation of the potentials on the lens rings can be used to control both the radial and longitudinal profiles of the electrostatic fields. While this certainly does not demonstrate superior performance, the argument here suggests that variation of the potentials on the individual rings can be used to control precisely those aspects of the electrostatic field that are important for designing low-aberration systems.

The multiple-ring electrostatic lens of the present invention is designed to aid in the transport of ions from an ion source to an ion trap. Some simple calculations demonstrate the degree of flexibility that can be expected from these lenses. Further numerical calculations, using a charged-particle transport code, demonstrates the performance expected from the prototype lens.

A full description of the motion of charged particles in electrostatic fields requires the solution of higher-order nonlinear differential equations that are derived from Newton's Law and Laplace's equation. Early theoretical work used mathematical simplifications that made analytical solutions possible. Thus, the first-order linear "paraxial" ray equation for axially-symmetric fields leads to so-called "Gaussian" optics for charged-particles that are very similar to their analogs for light-focusing systems. One key aspect of this approach is that the optics of a system can be calculated, given only the on-axis potential distribution of the system. This work was extended in 1936 by Scherzer, who determined the lowest-order spherical aberration of such a system. Scherzer found further that the spherical aberration of an axially symmetric potential was minimized for a potential distribution having a "Gaussian" form along the axis. Subsequent studies operating under a variety of assumptions, and using direct numerical integration of the equations of motion, have identified other symmetric potential distributions having somewhat smaller spherical aberration coefficients.

Figure 2:
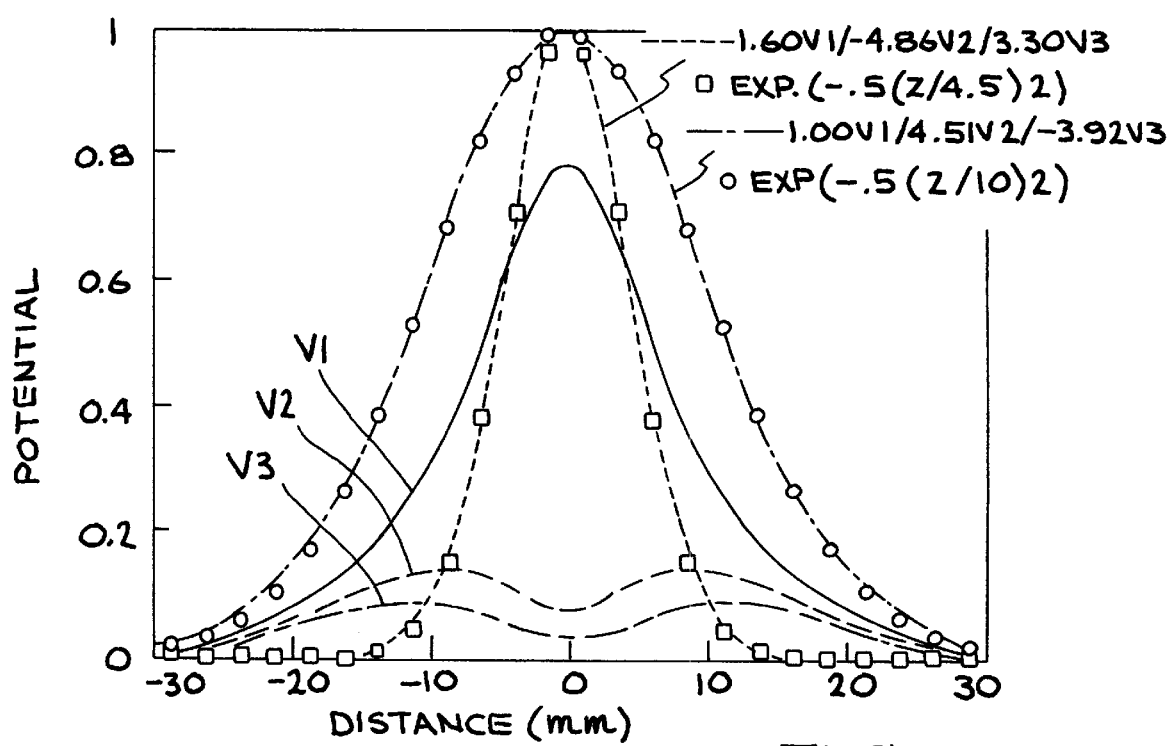
FIG. 2 shows two different combinations of potentials that approximate Gaussian distributions.

In order to get a preliminary indication of the possible usefulness of the multiple-ring lens, it is useful to study the axial potentials that can be generated by a particular choice of lens design. Consider then, a lens with three concentric rings having radii of 7, 12 and 16 mm. This choice of radii, which is arbitrary, was chosen to be similar to the radii of Airy diffraction rings. This lens, which is used below for ray-tracing calculations, also is centered in a shielding "can" 50 mm in diameter and 40 mm long. The can is needed to shield the lens from the fields of nearby structures. FIG. 2 shows plots of the axial potential distribution associated with each lens ring, as well as the overall potential for two different combinations of biases on all three rings. In all cases, the can is at ground potential.

The potential distributions in FIG. 2 were calculated using a second-order finite-element method. V1 represents the potential on the 7-mm ring, V2 the potential on the 12-mm ring, and V3 the potential on the 16-mm ring. The corresponding axial potential distributions also are linearly independent functions. As such, they can be added together to generate a wide variety of axial potential distribution functions.

FIG. 2 shows two different combinations of potentials that approximate Gaussian distributions. An iterative search found that the potentials V1 through V3 could be combined to give good fits to Gaussian potentials having widths σ from 4.5 through 10 mm. Attempts to fit narrower or broader σ's than this range gave progressively poorer fits. Similarly, the potential functions also were able to provide good fits to a variety of polynomial functions and other kinds of symmetric distributions.

Figure 3A:
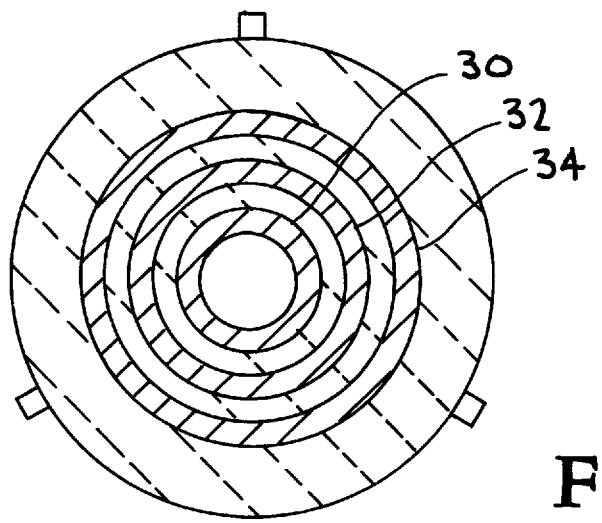
FIG. 3A shows a front view of the mechanical design of the prototype lens element.

The design of a concentric-ring structure that allows for independent biasing of the rings presents certain physical difficulties. The solutions to these difficulties depend on the size scale of the particular lens. In the present case, the lens is being used to focus a relatively large (diameter≈4 mm) ion beam with a relatively long focal length of abut 30 cm. FIG. 3A shows a front view of an embodiment of the prototype lens. The lens structure is based on copper rings and a thin sandwich of ceramic wafers. In a specific embodiment, the inner pair of rings 30 is a pair of 7-mm radius rings which form a hole through the center. The middle pair 32 and outer pair 34 of ring comprise pairs of the 12- and 16-mm rings, respectively, and are attached to opposing surfaces of the sandwich. The rings have 1-mm toroidal radii. Electrical connection to the rings is accomplished by bias leads consisting of thin ribbons of copper conductor that pass between the ceramic sandwich. Sheets of Kapton™ provide additional insulation between the rings and the bias leads. This design results in rings that have a total thickness in the axial direction of about 4.5 mm.

Electrical connection to the leads 12 is problematic. A prototype lens used thin ribbons of copper conductor that are passed between the layers of the ceramic "sandwich." However, testing of this device showed that this lens produced significant aberrations, due to the charges on the biasing conductors. The difficulty is that charges residing on the conducting strips constitute a significant asymmetric contribution to the overall charge distribution of the lens structure. This, in turn, introduces asymmetries into the resulting potential and field distributions of the lens.

In order to achieve low aberrations, it is critical that cylindrical symmetry of the potential and field distributions be rigorously maintained. This can be accomplished by using cylindrically symmetric conductors to bias the individual rings. This can be accomplished by inserting an additional shielded layer into the middle of the lens sandwich. This layer can be shielded on each side by thin conducting layers that provide small access holes for biasing of the rings from within the shielded layer. With this design, thin ribbons again can be used to bias the rings without disturbing the cylindrical symmetry of the system. The structure must include provision for mutual insulation between the biasing ribbons, in order to prevent arcing or electrical breakdown.

Another symmetric method of biasing the rings is to devote pairs of layers to providing the desired bias to both sides of individual rings. This method requires a multilayer sandwich structure of conducting and insulating layers that is robust with respect to applied bias potentials, but it rigorously maintains cylindrical symmetry.

Figure 3B:
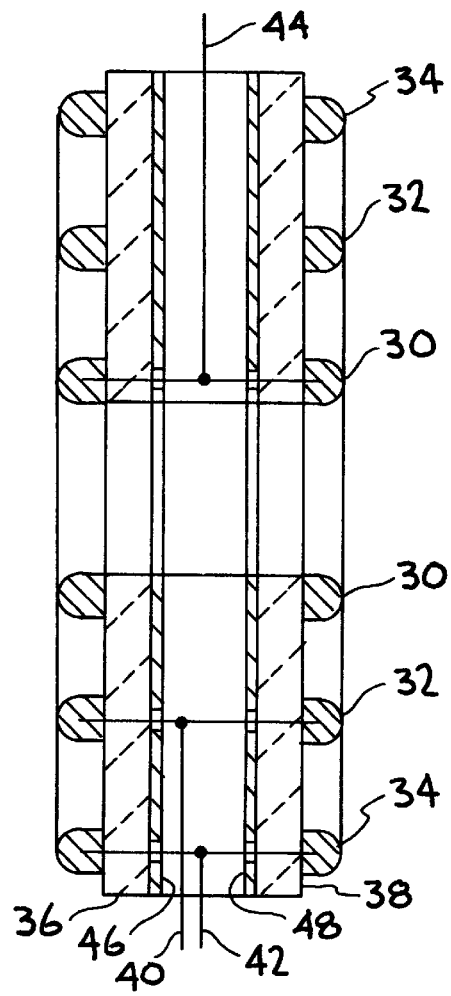
FIG. 3B shows a side view of the mechanical design of the prototype lens element of FIG. 3A.

FIG. 3B shows a side view of the electrostatic lens of FIG. 3A. This embodiment achieves low aberrations by rigorously maintaining cylindrical symmetry of the potential and field distributions. The electrostatic static lens comprises three axially symmetric pairs of co-planar conducting rings, 30, 32, and 34. A hollow interior insulator body comprising two machinable ceramic discs 36, 38, is located between and supporting the coplanar conducting rings. An insulated biasing lead 40, 42 and 44, is connected to each axially symmetric pair of co-planar conducting rings. A conducting ground plane 46, 48 is located between each insulated biasing lead and the two machinable ceramic discs 36, 38.

It is clear that several options exist for providing bias to the lens in a cylindrically symmetric fashion. These methods all present some problems with fabrication and design details, but they are critical to good performance of the lens. These methods ensure that the lens is capable of producing the cylindrical fields that are desired.

Figure 4:
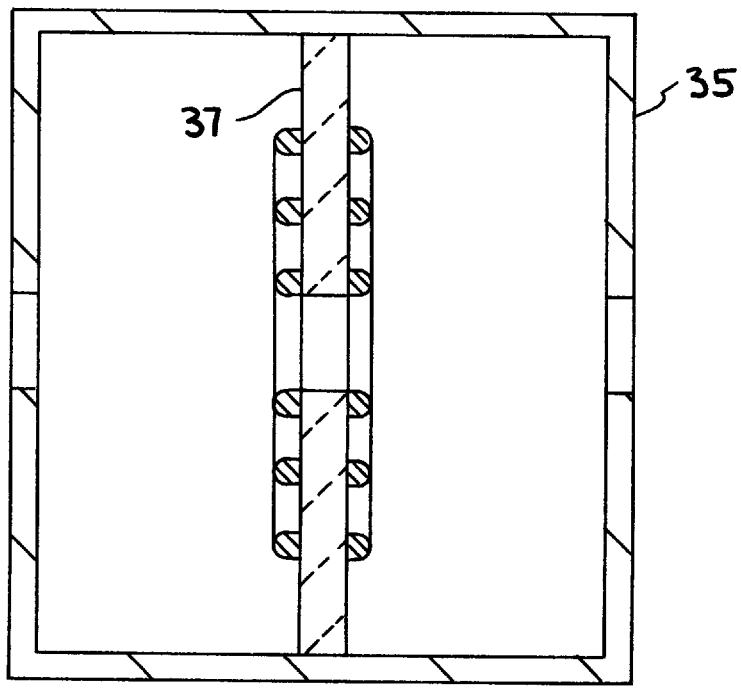
FIG. 4 shows the lens element mounted symmetrically inside a shielding can.

FIG. 4 shows the basic system that is used to characterize the performance of the lens. A 4-mm diameter beam of 10 keV ions is directed such that it is incident from the left of the canister 35 which houses the multiple-ring lens 37. The canister always is set to ground potential, and the lens rings then are set to the desired potentials.

The lens properties are calculated with a version of Munro's particle-beam programs, using a cylindrically symmetric second-order finite element to calculate the electrostatic fields. The calculation can accommodate multiple electrodes and accounts for the dielectric constants of insulating materials. A Runge-Kutta integration method is used to perform the particle trajectory ray tracing. The aberration coefficients are determined from the ray-tracing results.

Figure 5A:
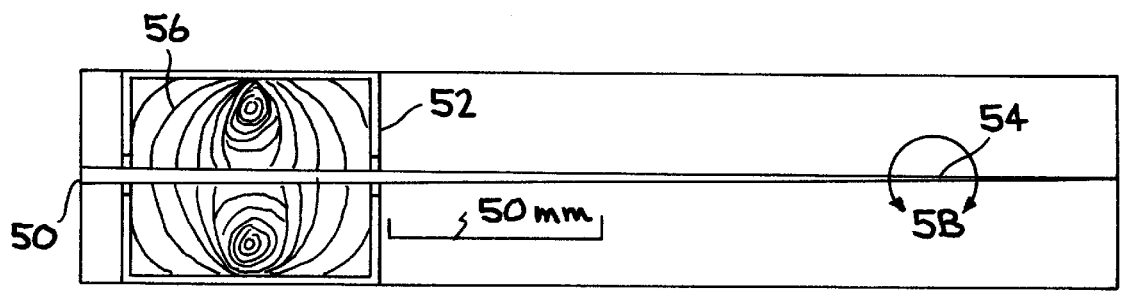
FIG. 5A shows one result of a ray-tracing calculations on one embodiment of the present invention.
Figure 5B:
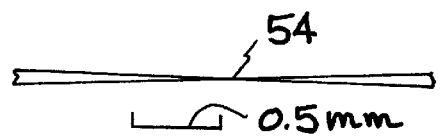
FIG. 5B shows an expanded view of the focal region 160 mm from the lens of FIG. 5A.

FIG. 5A shows the ray-tracing result for focusing a monoenergetic 10-keV ion beam with electrode potentials of 5000, 8000 and −12000 volts. The results show that the initial 4-mm beam 50 is focused by electrostatic lens 52 to a 50-μm spot diameter at 54. FIG. 5A shows the overall system, including the equipotential contours 56 in the vicinity of the lens 52. FIG. 5B shows an expanded view of the focal region 54 at a distance of 160 mm from the lens.

The ray-tracing solution also serves as the basis of calculations of spherical and chromatic aberration coefficients. For the present example with a focal length of 160 mm the spherical aberration coefficient, $C_s$, is about $2.3 \times 10^4$ mm and the chromatic aberration, $C_c$, is about 430 mm. These large coefficients are due partly to the long focal length of the system. A preliminary survey of focal characteristics with different bias voltages for the present lens indicates that for focal lengths of about 150 mm, $C_s$ increases roughly in proportion to the focal length. Additional calculations indicate that the optics of the prototype lens scale in a predictable way: smaller input beams produce smaller focal spots, and a system whose size, potentials and beam energy are scaled down by a factor of ten, for example, produce correspondingly smaller focal spots.

There are several points to consider with respect to adapting multiple-ring lenses to low-aberration systems. First, these lenses almost never would constitute an isolated system, but would be part of a larger geometry. Since the entire geometry contributes to the optics of a system, one question to consider is whether multiple-ring lenses increase the versatility in a system, compared to the unipotential surfaces that the lenses would replace. Such versatility might be most useful in compact systems where there is limited space for multiple optical elements in the axial direction.

Another point is that the present lens uses only three rings. A lens that uses a larger number of rings can be expected to provide greater flexibility in varying ring potentials to produce a desired electrostatic potential contour. As the number of rings becomes large, the design problem will become very complex, but it is not clear whether there is an optimum with respect to complexity and the performance of the final lens. It is entirely possible that a modest number of rings, say five, would be able to produce a lens with aberration coefficients that are substantially superior to the example with three rings that has been discussed above.

Changes and modifications in the specifically described embodiments can be carried out without departing from the scope of the invention, which is intended to be limited by the scope of the appended claims.

What is claimed is:

1. An electrostatic lens, comprising:
    a plurality of axially symmetric pairs of co-planar conducting rings;
    a hollow interior insulator body between and supporting said plurality of axially symmetric pairs of co-planar conducting rings;
    a insulated biasing lead for each axially symmetric pair of co-planar conducting rings of said plurality of axially symmetric pairs of co-planar conducting rings; and
    a conducting ground plane between each said insulated biasing lead and said hollow interior insulator body.

2. An electrostatic lens, comprising:
    a plurality of concentric pairs of co-planar conducting rings;
    a pair of insulators between and supporting said plurality of concentric pairs of co-planar conducting rings;
    a insulated biasing lead for each pair of co-planar conducting rings of said plurality of concentric pairs of co-planar conducting rings;
    means for providing electrical potential through each said insulated biasing lead to each said concentric pair of co-planar conducting rings and
    a conducting ground plane between each said insulated biasing lead and each insulator of said pair of insulators,
    wherein said plurality of concentric pairs of co-planar conducting rings exerts net focusing forces for particles passing near the center of said electrostatic lens.

3. The electrostatic lens of claim 2, wherein said plurality of concentric pairs of co-planar conducting rings has zero net charge.

4. The electrostatic lens of claim 2, wherein said plurality of concentric pairs of co-planar conducting rings allows for independent biasing of said co-planar conducting rings.

5. The electrostatic lens of claim 2, wherein said conducting rings comprise copper.

6. The electrostatic lens of claim 2, wherein said pair of insulators comprise a thin sandwich of ceramic wafers.

7. The electrostatic lens of claim 6, wherein said insulated biasing leads comprise thin ribbons of copper conductor that pass between said ceramic wafers.

8. The electrostatic lens of claim 2, further comprising additional insulation between said conducting rings and said biasing leads.

9. The electrostatic lens of claim 2, wherein said biasing leads comprise cylindrically symmetric conductors in order to achieve low aberrations by rigorously maintaining cylindrical symmetry of the potential and field distributions.

10. An electrostatic lens, comprising:
    a plurality of concentric co-planar conducting rings;
    a first insulator supporting said plurality of concentric co-planar conducting rings;
    a insulated biasing lead for each co-planar conducting ring of said plurality of concentric co-planar conducting rings;
    means for providing electrical power through each said insulated biasing lead to each said concentric co-planar conducting ring and
    a conducting ground plane between each said insulated biasing lead and said first insulator,
    wherein said plurality of concentric co-planar conducting rings exerts net focusing forces for particles passing near the center of said electrostatic lens.

11. The electrostatic lens of claim 10, wherein said plurality of concentric co-planar conducting rings has zero net charge.

* * * * *